(12) United States Patent
Singh

(10) Patent No.: US 7,019,344 B2
(45) Date of Patent: Mar. 28, 2006

(54) LATERAL DRIFT VERTICAL METAL-INSULATOR SEMICONDUCTOR FIELD EFFECT TRANSISTOR

(76) Inventor: Ranbir Singh, 164 Golden Ash Way, Gaithersburg, MD (US) 20878

( * ) Notice: Subject to any disclaimer, the term of this patent is extended or adjusted under 35 U.S.C. 154(b) by 0 days.

(21) Appl. No.: 10/859,565

(22) Filed: Jun. 3, 2004

(65) Prior Publication Data

US 2005/0269633 A1 Dec. 8, 2005

(51) Int. Cl.
*H01L 29/94* (2006.01)
(52) U.S. Cl. .................... 257/263; 257/329
(58) Field of Classification Search .......... 257/263, 257/302, 328, 329, 330
See application file for complete search history.

(56) References Cited

U.S. PATENT DOCUMENTS

| | | | |
|---|---|---|---|
| 5,264,713 A | 11/1993 | Palmour | |
| 6,281,521 B1 | 8/2001 | Singh | |
| 6,573,128 B1 | 6/2003 | Singh | |
| 6,660,375 B1 | 12/2003 | Miller et al. | |
| 2001/0024138 A1 | 9/2001 | Dohnke et al. | |
| 2002/0190258 A1 | 12/2002 | Harada et al. | |
| 2003/0168704 A1 | 9/2003 | Harada et al. | |
| 2003/0168919 A1 | 9/2003 | Friedrichs et al. | |

OTHER PUBLICATIONS

C Hatfield et al., "DC 1-V Characteristics and RF Performance of a 4H-SiC JFET at 773K," IEEE Transactions on Electron Devices, vol. 45, No. 9, Sep. 1998.
D. Alok et al., "4H-SiC RF Power MOSFETS," IEEE Electron Device Letters, vol. 22, No. 12, Dec. 2001.

R. Singh et al., "High Temperature SiC Trench Gate p-IGBTs," IEEE Transactions on Electron Devices, vol. 50, No. 3, Mar. 2003.
S. Banerjee et al., "1300-V 6H-SiC Lateral MOSFETs with two RESURF Zone," IEEE Electron Device Letters, vol. 23, No. 10, Oct. 2002.
R. Singh et al., "SiC Power Schottky and PiN Diodes," IEEE Transactions on Electron Devices, vol. 49, No. 4, Apr. 2002.
R. Singh et al., "Development of High-Current 4H-SiC ACCUFET," IEEE Transactions on Electron Devices, vol. 50, No. 2, Feb. 2003.
Trew et al., "The Potential of Diamond and SiC Electronic Devices for Microwave and Millimeter-Wave Power Applications," Proceedings of the IEEE, vol. 79, No. 5, May 1991.

(Continued)

*Primary Examiner*—Douglas W Owens
(74) *Attorney, Agent, or Firm*—Andrew Bodendorf

(57) ABSTRACT

A lateral drift vertical metal-insulated field effect transistor (LDVMISFET) with an optimum conducting channel formed in Silicon Carbide, is provided as a power transistor with a voltage rating of greater than 200 V. The lateral drift region achieves a better on-resistance/breakdown voltage trade-off than the conventional vertical drift region design of power MOSFETs. This is achieved by using an optimal doping and thickness for the voltage blocking and current conduction. The drain and backside terminal is able to support at least the rated blocking voltage of the device. A vertical MIS channel may be formed on the favorable 11-20 plane to achieve a higher MIS channel mobility as compared to the conventional 0001 or 000-1 planes resulting in a much lower on-resistance for the same blocking voltage as compared to conventional vertical MOSFET with similar blocking voltage.

22 Claims, 7 Drawing Sheets

OTHER PUBLICATIONS

Clarke et al., "SiC Microwave Power Technologies," Proceedings of the IEEE, vol. 90, No. 6, May 2002.

B. Jayant Baliga, "Trends in Power Semiconductor Devices," IEEE Transactions on Electron Devices, vol. 43, No. 10, Oct. 1996.

Friedrichs et al., "Stacked high voltage switch based on SiC VJEFTs," ISPSD, Cambridge, UK, Apr. 14-17, 2003.

Meneghesso et al., "Trap Characterization in Buried-Gate N-Channel 6H-SiC JFETs," IEEE Electron Device Letters, vol. 22, No. 9, Sep. 2001.

Rozario et al., "Thermal Cycling Study of SiC BGJFETs," IEEE 1998.

B. Weis et al., "Turn-off and short curcuit behaviour of 4H SiC JFETs," IEEE 2001.

LATERAL DRIFT VERTICAL METAL-INSULATOR SEMICONDUCTOR FIELD EFFECT TRANSISTOR

TECHNICAL FIELD

The following description relates generally to semiconductor devices, and in particular to power and microwave transistors using widebandgap semiconductors.

BACKGROUND

Most conventional semiconductor power transistors are almost exclusively formed using silicon (Si). Due to the relative maturity of the use of this semiconductor, the performance of conventional power transistors to carry high currents and block high voltages is closely approaching the theoretical limit for Si. For example, power MOSFETs made using Si have undergone many improvements over the past two decades and allowing them to block 30 to 1,200 volts while providing relatively low on-state resistance values.

However, there are many applications for power devices that require the ability to carry high currents and block voltages in the range of 600 V to 15 kV (and greater). These applications include motor control, power supply, lighting ballast, power transmission and generation, and utility power conversion. Unfortunately, the overall performance of power devices made using Si is poor for this voltage range, and the lack of such power devices represents the primary limitation in realizing circuits for these applications. In fact, if high voltage devices that support such high currents and operate at frequencies of one to 100 kHz were available, they would revolutionize power utility applications and result in power savings of as much as $20 billion in the United States.

One recent development in semiconductor power devices is the use of Intelligent Power Modules (IPMs). IPMs use low voltage CMOS circuitry that may be integrated with power devices. Other examples of intelligent power devices include discrete integrated power devices that detect unacceptable current, voltage, and temperature conditions. However, the relatively low blocking voltage of semiconductor power devices made using Si limits the application of these devices in majority carrier devices (e.g., devices that rely on resistive current transport) to 1200 V or less.

For higher power devices (e.g., those blocking voltages greater than 1200 V), bipolar devices, such as, insulated gate bipolar transistors (IGBTs) and Thyristors have been used. While these devices offer acceptable on-state performance, they suffer from relatively slow switching speeds and poor performance at high temperatures.

Other power devices that have been researched also suffer from various deficiencies. For example, Bipolar Junction Transistors (BJTs) use a current control gate rather than a preferable voltage control gate. Many vertical junction field effect transistors (JFETs) operate in a "normally-on" mode during their on-state condition; however, JFETs with the preferable "normally-off" mode have poor on-state resistances. Finally, thyristors have high on-state voltage drops (because of their inherent junction drop) and slow switching speeds.

A variety of power devices using silicon carbide (SiC) have been researched and implemented in an attempt to provide devices that block high voltages and carry high currents. One switching power device is the vertical power MOSFET. However, vertical power MOSFETs made using SiC suffer from poor performance and poor reliability because of low inversion layer channel mobility. In addition, the tunneling current between SiC and the gate dielectric of power devices made using SiC limits their reliability during long term operation.

Another area in which semiconductor devices are being used is the microwave transistor. Microwave transistors are expected to work at very high frequencies, for example, at 800 MHz to 10 GHz (and greater). Most conventional microwave devices are formed using gallium arsenide (GaAs) and Si structures. For example, GaAs structures include the high electron mobility transistor (HEMT), the Heterojuncntion Bipolar transistor (HBT), and the pseudomorphic HEMT. These transistors are the most commonly used lower power (e.g., fractional to 10 W) transistors. Their applications inlcude cell phone handsets and low power networking devices.

Higher power (e.g., especially in the L-Band (400 MHz to 1 GHz), S-Band (1–3 GHz) and X-band (7–10 GHz)) transistor applications also exist including military radars and cellular phone base-station applications. These transistors may be combined with passive components to form integrated circuits that provide higher usable power levels and match external circuit components. Such integrated circuits are called microwave and millimeter wave integrated circuits (MMICs).

One example of a high power microwave device formed using SiC is the lateral power Metal-Semiconductor FET (or MESFET). A MESFET is operated by controlling the source to drain current using a Schottky gate located between these terminals (known as a T-gate). Due to the extremely high current densities in the localized region inside the MESFET, the junction temperature at the Schottky contact may significantly exceed the ambient temperature and result in a high leakage current at the gate and premature breakdown. As a result, the source terminal of the microwave MESFET must be firmly held at ground potential to achieve stable performance.

To hold the source terminal of a microwave MESFET at ground, via holes inside the source terminal must be placed through the wafer to the backside metal contacts. As a result, the yield of chips made using ultra-fine lithography is reduced (and therefore the cost of producing such chips is increased). Because the T-gate significantly increases the cost of making these chips, the use of MESFETs for many high power density microwave applications may ultimately be limited.

As an alternative to MESFETs, microwave JFETs with p-type gate regions located between the source and drain contacts have been used in an attempt to provide better robustness. However, JFETs also suffer from poor high frequency performance in microwave applications because of the challenge in making small gate widths that minimize gate to source and gate to drain capacitances.

SUMMARY

According to one general aspect, a lateral drift vertical metal-insulted field effect transistor (LDVMISFET) formed in a widebandgap semiconductor includes one or more layers of the widebandgap semiconductor having a first conductivity and a first and a second surface; one or more layers of the widebandgap semiconductor having a second conductivity formed in contact with the first surface of the one or more layers of the second conductivity, including at least a drift layer; a sub-source terminal formed in contact with the second surface of the one or more layers of the first conductivity; one or more mesa regions formed in contact with the resurf layer including a source terminal and a gate terminal; a drain region in contact with the resurf layer spaced apart from the mesa regions; vertical conduction path in the mesa region; and a lateral current conduction path in the one or more layers of the second conductivity type between the mesa region and the Drain region.

The LDVMISFET may have a lateral breakdown voltage between the gate terminal and the drain region and a vertical breakdown voltage between the drain region and the sub-source, where the lateral breakdown voltage is less than or equal to the vertical breakdown voltage. In addition, the LDVMISFET may have a blocking voltage of 300 V to 25 kV.

The one or more layers of the first conductivity may include a substrate layer having a carrier concentration of dopant atoms of 0 $cm^{-3}$ to $1 \times 10^{22}$ $cm^{-3}$ having a thickness of 100 to 500 μm. The resurf layer may have a carrier concentration of dopant atoms of $1 \times 10^{15}$ $cm^{-3}$ to $1 \times 10^{19}$ $cm^{-3}$ and a thickness of 0.01 to 5 μm.

The one or more layers of the first conductivity also may include a layer between the substrate layer and the resurf layer having a carrier concentration of dopant atoms of less than $10^{17}$ $cm^{-3}$.

The semiconductor of the LDVMISFET may have a bandgap EG greater than 2 eV and less than 8 eV. For example, the semiconductor may be one of silicon carbide, diamond, aluminum nitride, and gallium nitride. The face of the silicon carbide may be one of 0001, 000-1, and 11-20.

The LDVMISFET may have a specific on resistance of less than 300 mΩ-$cm^2$.

The first conductivity of the LDVMISFET may be p type and the second conductivity may be n type.

In another general aspect, the the one or more mesa regions may include a region of the first conductivity and at least one region of the second conductivity, each forming a wall of the mesa region, the vertical conduction path formed between the source region and the region of the first conductivity. An insulator may be formed on the wall, where the gate is formed on the insulator. In one example, the gate is formed in the 11-20 plane. The LDVMISFET may include two, three, or mesa regions per drain region.

Other features will be apparent from the description, the drawings, and the claims.

DESCRIPTION OF DRAWINGS

Like reference symbols in the various drawings indicate like elements.

DETAILED DESCRIPTION

The following description of the various implementations and embodiments illustrates general concepts of the invention which may suggest various alternatives to those skilled in the art. For example, the description makes reference to certain layers and regions being formed of a first conductivity type (e.g., n-type) and a second conductivity type (e.g., p-type) in addition to various dopings (e.g., + and −) of these areas. However, complementary devices also may be produced according to the descriptions below, such as, for example, the first conductivity type may be a p-type semiconductor and the second conductivity type may be an n-type semiconductor.

The various layers and regions may be fabricated using a number of conventional semiconductor fabrication techniques including solid source crystal growth, molecular beam epitaxy, gas source metal-organic chemical vapor deposition, wafer bonding, lithography, thermal oxidation, metallization, etching, and/or combinations thereof.

It also will be appreciated that the figures show general concepts and that sizes and dimensions of layers or regions may be exaggerated for illustrative purposes to show general structures, and are not necessarily to scale. In addition, references to a layer being formed on another layer or substrate may contemplate that additional layers intervene. Likewise, a referenced layer may include implementations formed of multiple layers or doping regions.

LDVMISFET Structure

The device structures described below are for fabrication in all semiconductors with a bandgap (EG) greater than or equal to approximately 2 eV and less than or equal to approximately 8 eV. For example, this includes silicon carbide (with EG range of 2.1 eV to 4 eV), diamond (EG 5 eV), aluminum nitride (EG 6.1 eV), and gallium nitride (with EG range 3 eV to 5 eV). In addition, all faces of the crystal structure of these semiconductors may be used. For example, faces for SiC include the 0001 plane (i.e., the silicon face), the 000-1 (i.e., the carbon face), and the 11-20 plane. The carbon face may offer additional benefits because of the lower temperatures needed to oxidize that face of SiC (making the carbon face particularly suitable for processing in conventional Si foundries).

Figure 1:
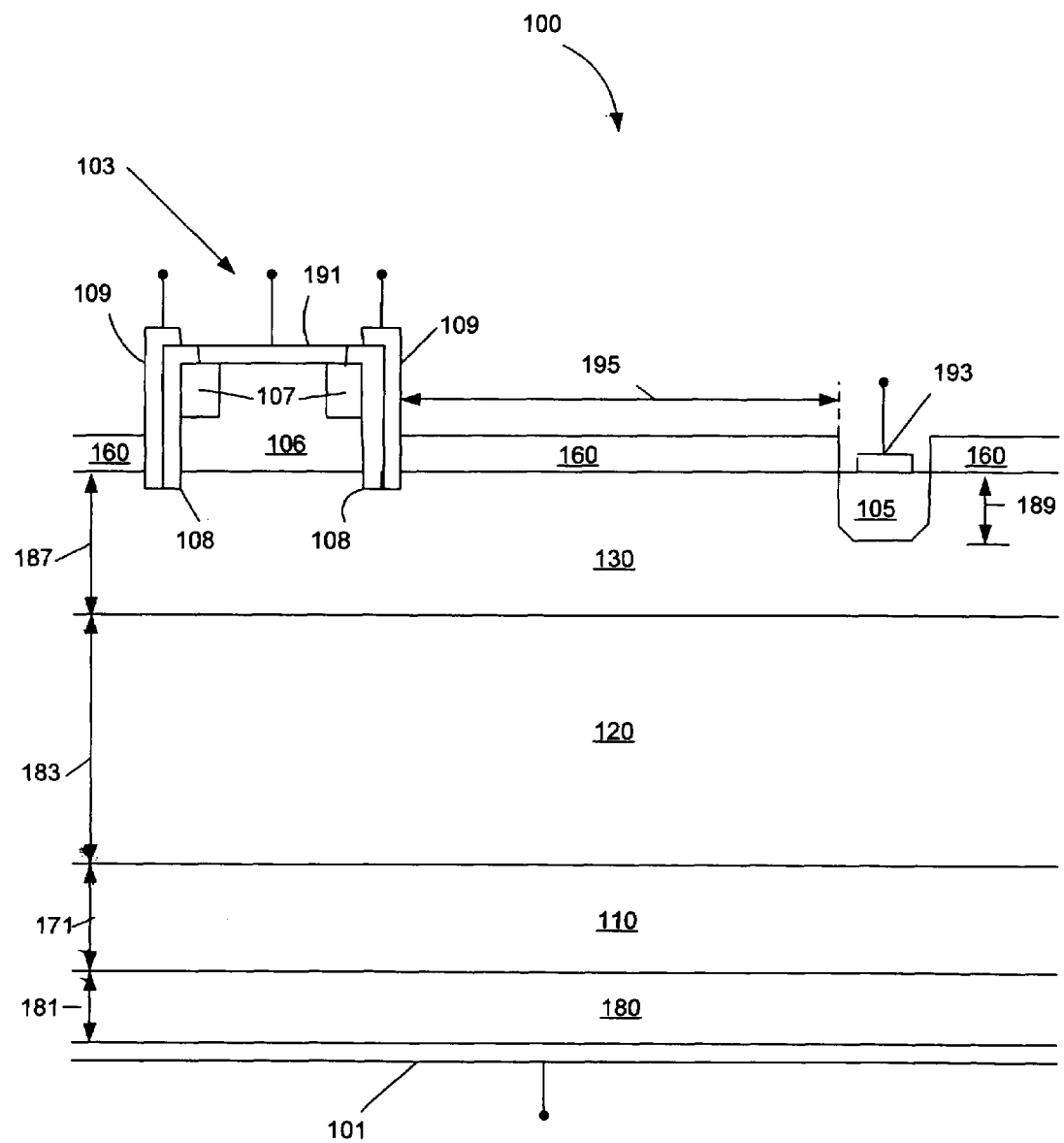
FIG. 1 shows an exemplary cell of a LDVMISFET structure having an optimally doped conduction path between the Drain and the Source.

FIG. 1 shows one example the structure of a LDVMISFET. As shown by the exemplary implementation illustrated in FIG. 1, a cell 100 of the LDVMISFET includes an external substrate source (sub-source) contact 101 with an optimally doped conduction path between a mesa region 103 and a drain region 105. The mesa region 103 includes a p-type region 106, a source n+ region 107, an insulator 108 and a vertical gate metal layer 109. The cell 100 may include up to three or more layers including a first layer 110, a second layer 120, and a third layer 130. The area between the gate 109 and the drain region 105 may be filled with a passivating dielectric 160.

The first layer 110 may be formed using a p-type substrate having an external substrate contact or sub-Source 101. In one implementation, the layer 110 may have a thickness ($t_{substrate}$) 171 of approximately 100–500 μm with a doping of zero to $10^{22}$ $cm^{-3}$.

An optional very thin, highly doped backside layer 180 of the same conductivity type as layer 110 may be ion implanted in the substrate 110 or epitaxially grown thereon having a thickness 181 of 0.01 to 1 μm and a doping $N_{sub}$ of greater than $10^{17}$ $cm^{-3}$. The highly doped backside layer 180 may be provided to prevent the vertical electric field from reaching the external sub-source terminal 101.

The second layer 120 may be formed of a low doped p-type conductivity semiconductor between layer 110 and layer 130. The layer 120 may be grown (e.g., using a high quality epitaxial process) on layer 110 to a thickness ($t_{backgate}$) 183 of one to 200 µm with an acceptor doping $N_A$. If layer 110 has a doping less than or equal to $10^{17}$ cm$^{-3}$, layer 120 is optional. However, when the doping of layer 110 exceeds $10^{17}$ cm$^{-3}$, layer 120 should be included with a doping $N_A$, for example, of $10^{13}$ cm$^{-3}$ to $10^{18}$ cm$^{-3}$. A more precise description of how to determine $N_A$ is given below.

The third layer 130 (i.e., the resurf layer) may be epitaxially grown or ion implanted with an optimal doping $N_{resurf}$. Tolerance on the doping $N_{resurf}$ and thickness of layer 130 ($t_{resurf}$) 188 is roughly plus or minus 50% from the optimal doping calculated using the design equations given below. Layer 130 may be doped from $10^{15}$ cm$^{-3}$ to $10^{19}$ cm$^{-3}$ having a thickness 188 of 0.01 to 1.0 µm.

The mesa region 103 includes a p-type region which may be epitaxially grown on layer 130. The mesa region 103 may include one or more highly doped n+ source regions 107. The source regions 107 may be formed by growing an n+ region on top of the p-type region, or the n+ region may be ion implanted in the p-type region to form a vertical MIS channel. The vertical mesa region 103 is formed by removing a portion of the n+ region and the p-type region, such as, for example, in the 11-20 plane, and an insulator 108 (e.g., a oxide or a nitride) may be deposited or thermally grown on the side walls of the mesa region 103 to an optimum thickness of between 5 nm and 200 nm. A metallized source terminal 191 may be placed over the surface of the source regions 107 and the intervening p-type region 106. Metallized gate regions 109 may be deposited on the walls of the insulator region 108, for example, in the 11-20 plane.

The drain region 105 may be formed of highly doped n+ area to form a low resistance ohmic contact for the drain terminal 193. The drain region 105 may be ion implanted (in layer 130) or epitaxially grown (on layer 130) with doping, for example, greater than $10^{17}$ cm$^{-3}$ with a thickness 189 of 0.01 to 1 µM.

The area between the gate 109 and drain 105 may be filled with an appropriate passivating dielectric 160, such as, for example, silicon dioxide, silicon nitride, polyimide, deposited SiC, deposited diamond, or other high-k dielectrics. The length 195 (i.e., $L_{drift}$) of the area between the gate 109 and drain 105 may be determined according to the design conditions described in further detail below.

The structure of the LDVMISFET provides a vertical channel in the mesa region and a lateral drift channel between the gate and the drain. A lateral drift region offers a lower specific on-resistance than a vertical drift region with a comparable blocking voltage capability because of the field shaping. A lateral drift region also obviates the need for very long edge termination regions required in a conventional vertical drift region design. Further, in 4H and 6H silicon carbide, a higher channel mobility (and hence lower channel resistance) is observed when the MIS regions are formed on the 11-20 direction as compared to the conventional 0001 direction for vertical power MOSFETs. A higher channel mobility not only improves performance of MOSFETs by lowering its on-resistance for a comparably rated vertical power MOSFET, but also improves gate reliability by reducing the electric field in the gate insulator while the device is conducting as well as in the voltage blocking state. The electric field in the gate insulator is lower in the on-state because it offers a higher channel mobility. In the voltage blocking state the electric field in the insulator is not as high as in the case of a trench MOSFET because the gate oxide is not physically close to the highest electric field region of the device.

LDVMISFET Design

The resurf layer 130 ensures that the electric field at the surface of layer 130 is sufficiently low (e.g., in one implementation 0 V/cm) when the LDVMISFET is blocking its highest voltage (BV). In one implementation, an electric field of 0 V/cm may be maintained at the surface of resurf layer 130 if the electric field at the voltage blocking junction (e.g., the junction between layer 120 and layer 130, and layer 110 and 130 (if layer 120 is not present)) is close to the critical breakdown electric field $E_{cr}$ of the semiconductor. Approximate values for $E_{cr}$ for various semiconductors are:

$E_{cr, Si}$: 0.25 MV/cm
$E_{cr,SiC}$: 2 MV/cm
$E_{cr,C}$: 5 MV/cm

The optimal doping of resurf layer 130 by thickness of the layer 130 may be expressed as:

$$\frac{1}{L_{Drift}} \int_0^{t_{resurf}} \int_0^{L_{Drift}} N_{resurf}(x,y) \partial x \, \partial y = \frac{\varepsilon \times E_{cr}}{q},$$

where $\in$ is the dielectric constant of the semiconductor (e.g., 11.9X$\in_r$ for Si, 9.7X$\in_r$ for SiC, and 5X$\in_r$ for diamond) where $\in r$ is the permittivity for air (e.g., 8.854×10$^{-14}$ F/cm) and 'q' is the electronic charge (1.602×10$^{-19}$ C). If the doping in the resurf layer 130 is constant along the drift length 195 and its depth (i.e., $t_{resurf}$), the optimum charge in the resurf layer 130 may be expressed as:

$$N_{resurf} \times t_{resurf} = \frac{\varepsilon \times E_{cr}}{q}.$$

Although constant doping is used for the following analysis, uniformly varying doping in the resurf layer 130 may be preferred for a LDVMISFET blocking greater than 2 kV and to provide a more uniform electric field in this layer, as explained in further detail below.

The BV (i.e., the highest voltage blocked at the drain) may be expressed as the lesser of the two:

$BV_{Lat}$=(Between 1 and 0.5)×($L_{Drift}$×$E_{cr}$) (the approximate lateral breakdown condition); and $$BV_{Vert} = \frac{1}{2} \times t_{backgate}\left(E_{cr} + \frac{qN_A}{\varepsilon}t_{backgate} + \frac{1}{2} \times \frac{qN_A^2}{\varepsilon N_{Subs}}t_{backgate}\right)$$

the approximate vertical breakdown condition). These equations express two competing breakdowns: a vertical breakdown and a lateral breakdown. In order to design an LDVMISFET with the lowest on-resistance for a given blocking voltage, the vertical blocking voltage should be greater than or equal to the lateral blocking voltage. Approximate formulae for the lateral and the vertical breakdowns are given above. There is a trade-off between the blocking voltage capability of the device and its on-resistance. In this case, the higher the breakdown voltage, the higher the on-resistance. While these general formulae express the highest voltage blocked by the drain of the LDVMISFET, the actual BV of any given LDVMISFET may depend on a variety of factors, such as, for example, fabrication processing, edge termination, and device dimensions.

Figure 2:
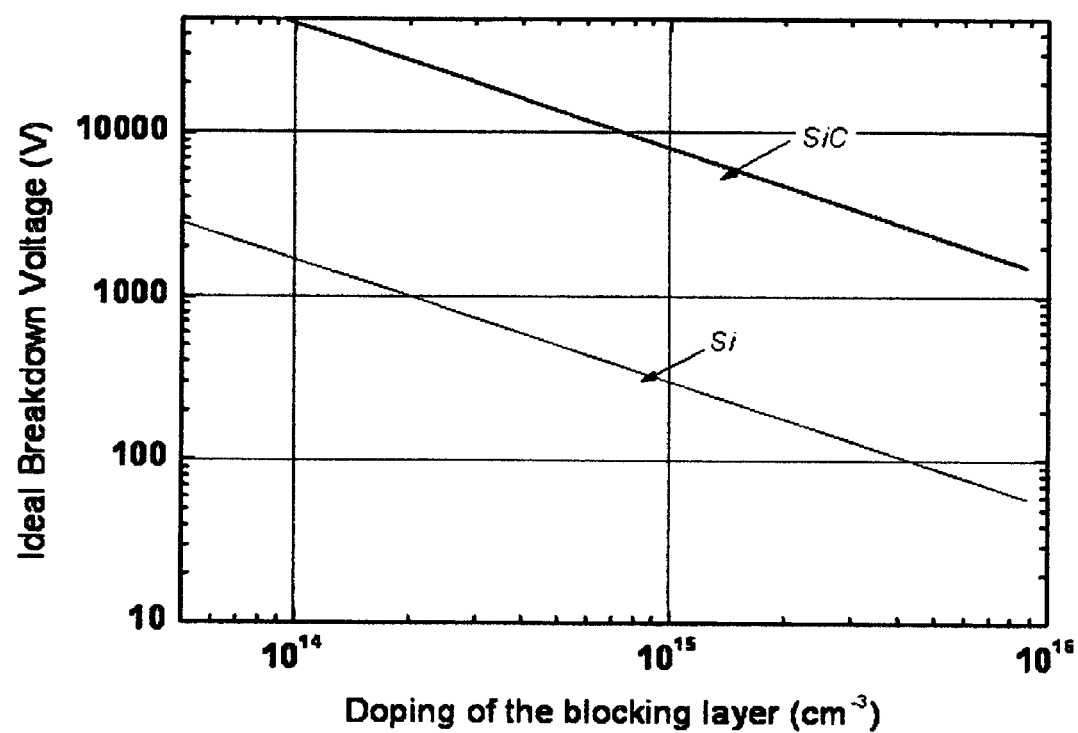
FIG. 2 shows an exemplary illustration of ideal breakdown voltage versus doping of the blocking layer for silicon and silicon carbide.

A comparison of the ideal breakdown voltage versus the doping of the blocking layer (for a vertical formed using Si and SiC) is illustrated in FIG. 2. As shown in FIG. 2, as the doping of the blocking layer is decreased, higher ideal breakdown voltages may be attained for the vertical breakdown condition.

Figure 3:
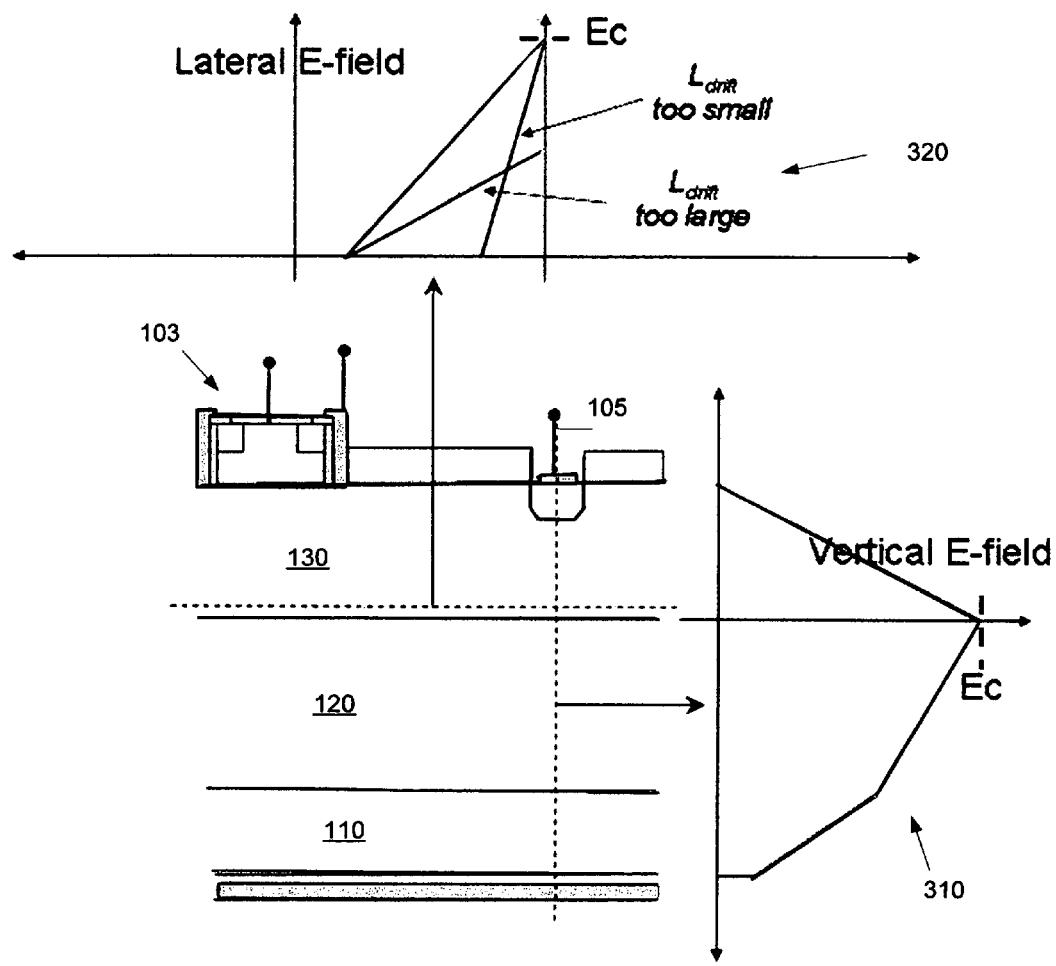
FIG. 3 shows an exemplary LDVMISFET structure with illustrations of the vertical and the lateral electric fields.

FIG. 3 illustrates several electric fields in a cell 100 of the LDVMISFET shown in FIG. 1, when $V_{sub-source}=0$ V, $V_{source}=0$ V, and $V_{drain}=BV$. The vertical electric field 310 along the drain to sub-source junction and the lateral electric field 320 close to the PN junction are plotted in FIG. 3. When the drain voltage is increased, the electric field 310 between the sub-source to drain junction increases until it approaches the critical electric field of the semiconductor $E_{cr}$. When the applied drain voltage causes the sub-source to drain junction electric field to exceed $E_{cr}$, the LDVMISFET suffers a sub-source to drain breakdown (i.e., a vertical breakdown). The lateral breakdown voltage may be determined by the length of the drift region (i.e, $L_{drift}$). $L_{drift}$ may be determined so that the electric field 320 is near zero at the resurf layer when the full BV is applied at the drain terminal. The electric field along the lateral direction decreases monotonically from the drain terminal towards the source, and may be expressed as:

$$E(x) = \frac{qN_{resurf}}{\varepsilon}x,$$

where x=0 corresponds to the location of the gate. A maximum voltage on the drain is supported with the least drift region resistance for the drift region length 195, which may be expressed as:

$$L_{Drift} = \frac{(\text{Between 2 and 1}) \times BV_{Lat}}{E_{cr}}$$

(assuming vertical breakdown does not occur before BV is achieved). If $L_{Drift}$ is sufficiently long, as specified by this equation, the value of BV is as given previously for the defined lateral breakdown formula.

Layout of the LDVMISFET

Figure 4:
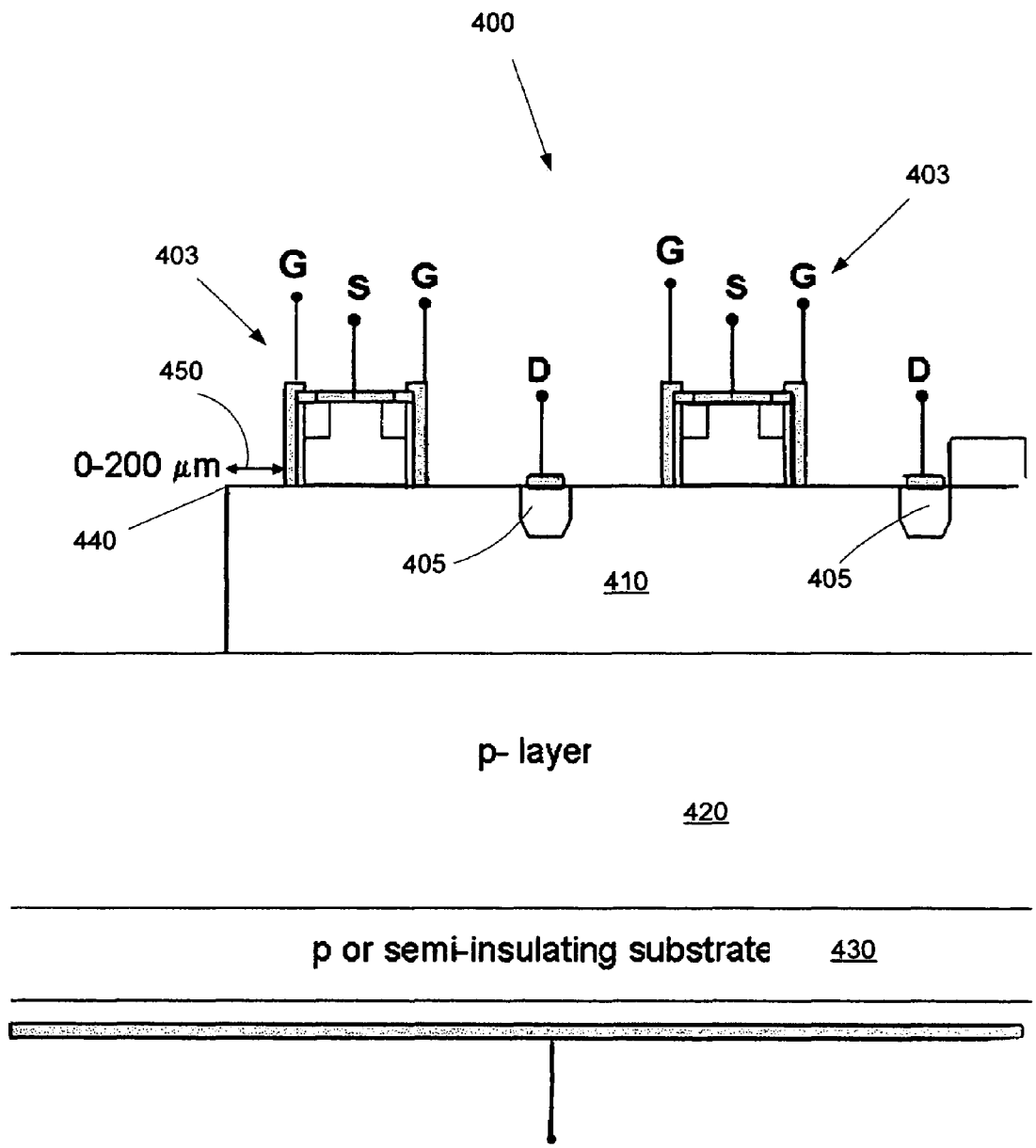
FIG. 4 shows an exemplary LDVMISFET formed using the cells of FIG. 1.

The structure of a cell of the LDVMISFET is shown in FIG. 1 and described above. However, an entire power transistor chip may be formed using multiple cells 100. For example, FIG. 4 shows a schematic diagram of the cell 100 of FIG. 1 repeated and mirror imaged to form a power transistor chip 400. As shown in FIG. 4, one or more n type layers 410 are formed on one or more p type layers 420 and/or a substrate 430. In addition, a number of mesa regions 403 and drain regions 405 are formed in contact with the n type layer 410. The outer edge 440 of the one or more n-type layer 410 does not necessarily extend to the edge of the p layer 420 and p substrate 430. To confine the electric field, the edge 440 of top n-type layer 410 (e.g., layer 130) may be extended beyond the mesa region 403 by a predetermined length ($L_{extend}$) 450. $L_{extend}$ may be determined according to the BV rating of the device for which the LDVMISFET is to be used, such as, for example, between zero to 200 μm.

Figure 5:
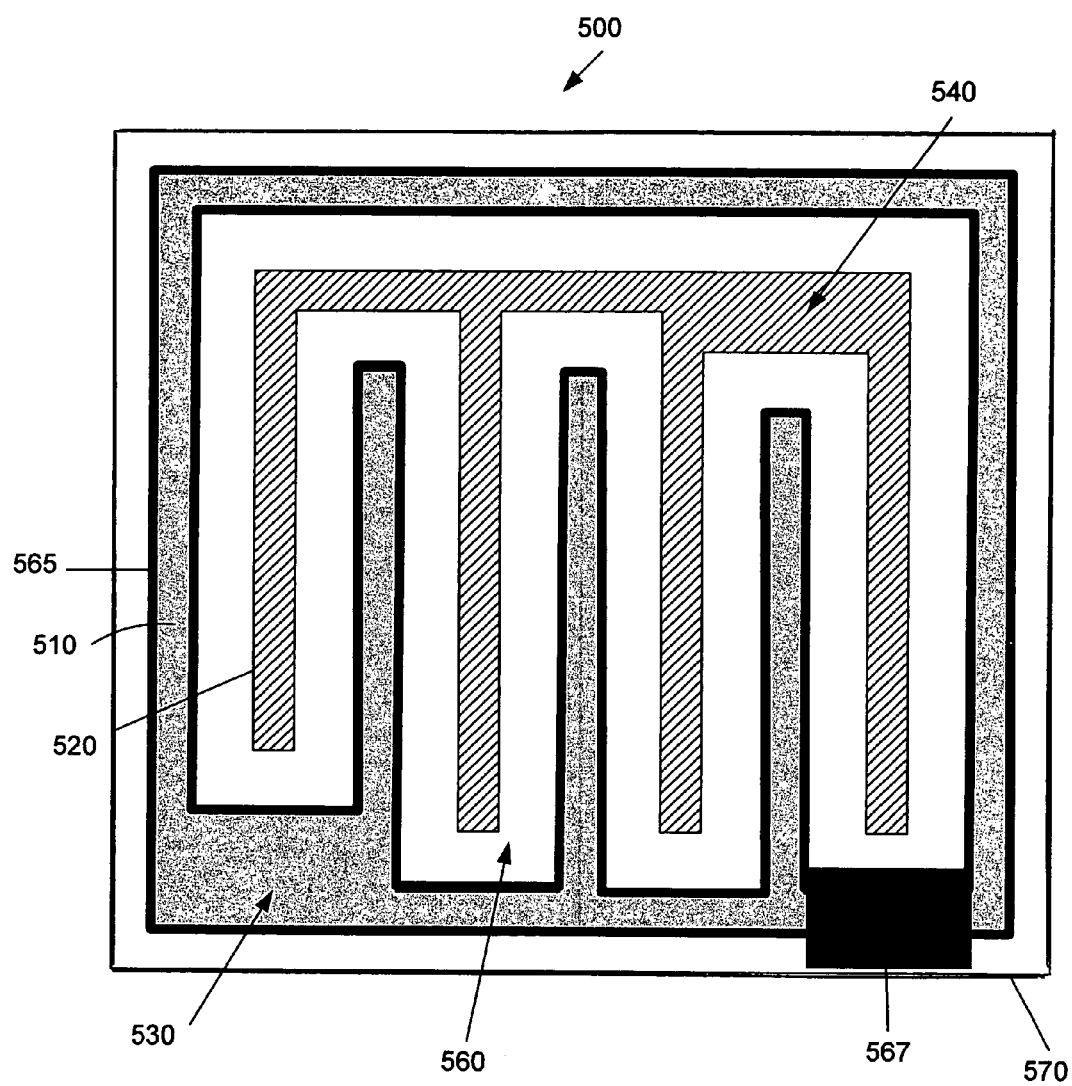
FIG. 5 shows an exemplary single chip, top view layout of a LDVMISFET.

FIG. 5 shows an exemplary top view of a single chip 500 incorporating the LDVMISFET structure. As shown, an source n+ metallization area 510 and a drain n+ metallization area 520 may form interdigitated fingers, connected by a source bond pad 530 and a drain bond pad 540, respectively. A passivating dielectric region 560 surrounds the drain area 520. A gate metallization area 565 is formed between the source metallization area 510 and the drain metallization area and is connected to a gate bond pad 567 on the exterior of the top surface. The entire chip may be formed on a substrate 570. Of course, other configurations of the source, gate, and drain areas may be implemented, for example, they may form a serpentine layout. Different configurations of the bond pads may be used including multiple source, gate, and drain bond pads with isolated fingers on the same chip.

Figure 6:
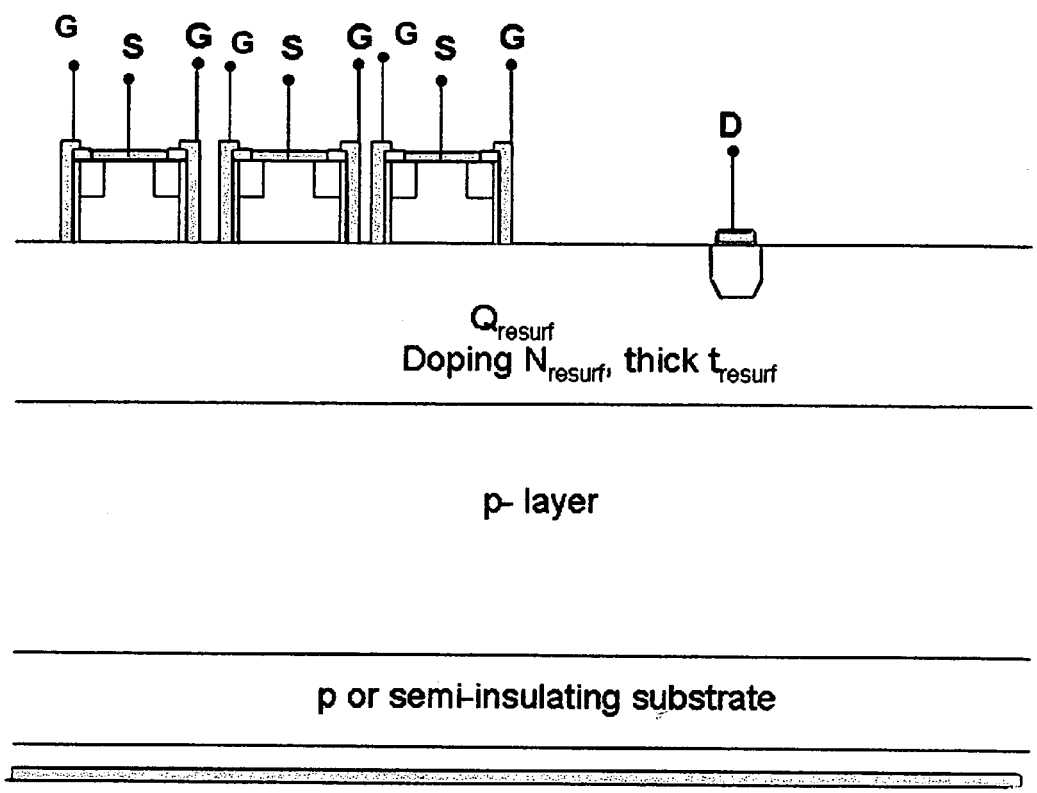
FIG. 6 shows an exemplary LDVMISFET with multiple mesa regions per drain region.

FIG. 6 shows another exemplary embodiment including multiple mesa regions per drain region. As shown, the transistor includes layers 110, 120, and 130 including a sub-source terminal and drain region. In addition, three mesa regions are formed in close proximity on the resurf layer 130. It is often beneficial to have a high density of MIS channels per unit area of a MISFET in order to achieve a very low on-resistance. This can be achieved by introducing multiple mesa regions, which include correspondingly large number of channel regions in order to achieve a large number of channels for a given topside area of the device. These mesa regions may be formed as close to each other as the photolithography techniques used to make these devices allow. Although three mesa regions are shown in FIG. 6, other combinations of multiple mesa regions may be formed according to the desciptions provided herein (e.g., 2, 4, 5, 6, and higher).

Figure 7:
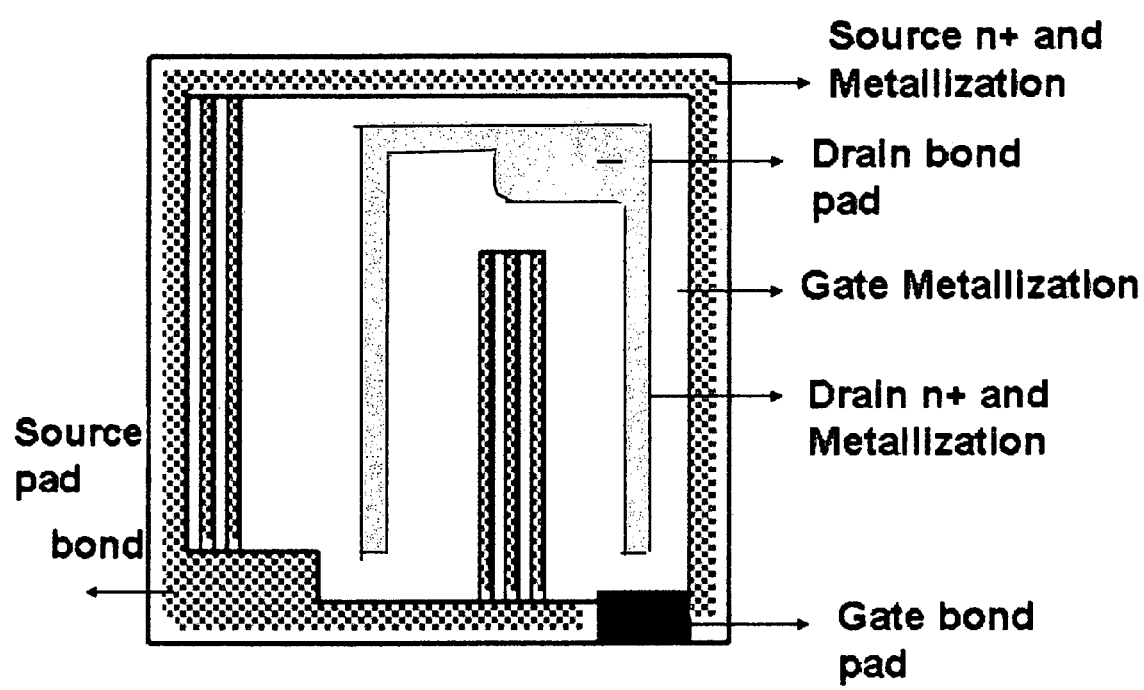
FIG. 7 shows an exemplary single chip, top view layout of a LDVMISFET with multiple mesa regions per drain region.

FIG. 7 illustrates a top view of a power transistor for the cell structure shown in FIG. 6.

Widebandgap semiconductors like SiC and diamond offer excellent properties for the realization of high performance, next generation power and microwave (RF) devices. These properties include: an order of magnitude higher breakdown electric field; a much higher thermal conductivity; and a wider bandgap than silicon. A high breakdown electric field allows the design of power devices with thinner and higher doped blocking layers. This allows design of power devices with two orders of magnitude lower on-resistance in majority carrier devices. The high thermal conductivity also allows dissipated heat to be readily extracted from the device. The large bandgap results in a much higher operating temperature and higher radiation hardness. As a result, a larger power can be applied to the device for a given junction temperature.

Conventional power and microwave transistors made with these semiconductors face various challenges in terms of performance and ease of manufacture. Three major performance parameters are: on-resistance for a given area (called specific on-resistance), breakdown voltage, and switching speed. There exists a fundamental trade-off between specific on-resistance and the breakdown voltage achieved using a particular thickness of semiconductor. Counter-intuitively, LDVMISFETs offer one half to one quarter resistance for a given breakdown voltage as compared to vertical power transistors. Yet a vast majority of conventional transistors are designed with a vertical design because most conventional designs in Si (the dominant material for power device realization) use such a design. A veritical design is used because semi-insulating and insulating versions of Si are difficult to achieve as compared to highly conducting versions. On the other hand, many widebandgap transistors are realized in semi-insulating and insulating versions.

The LDVMISFET offers at least the following advantages over conventional vertical transistors. The LDVMISFET provides a lower specific on-resistance because of a fundamental trade-off between on-resistance and breakdown voltage. The LDVMISFET also provides a lower resistive on-state voltage drop at a given current density. The theoretical specific on-resistance of a vertical power transistor is expressed as:

$$R_{on,sp,VPD} = \frac{4\, BV_{VPD}}{\varepsilon\varepsilon_r \mu E_{cr}^3},$$

where $R_{on,spVPD}$ is the specific on-resistance of the vertical power transistor, $BV_{VPD}$ is the theoretical breakdown voltage of a vertical power transistor, $\mu$ is the bulk mobility of the current carriers, and $E_{cr}$ is the critical electric field of the semiconductor. The specific on resistance of the LDVMISFET may be expressed as:

$$R_{on,sp,LPD} = (\text{Between 1 and 2})\,\frac{BV_{LPD}}{\varepsilon\varepsilon_r \mu E_{cr}^3}.$$

Therefore, the specific on-resistance (on-resistance for a given chip area) of a LDVMISFET is two to four times lower than that formed in vertical power transistors.

Another advantage of the LDVMISFET is a significantly smaller total power transistor chip size because of the lack of an extensive edge termination region. Conventional vertical power transistors have a lateral edge termination length beyond the source/drain contact areas in order to terminate the high electric fields at the edge of these devices. The length of the edge termination region is dependent on the breakdown voltage rating of the transistor. The edge termination length is approximately two to five times the thickness of the voltage blocking layers. Since the edge termination region does not contribute to current conduction (it is required to block the voltage), it results in an unused area of the power transistor chip with no contribution to the on-resistance.

In contrast, the LDVMISFET may provide high voltage drain terminals that are completely surrounded by the source terminals (which are close to ground potential during the reverse bias operation of the transistor). Therefore, the edge termination length beyond the source area of the LDVMISFET is minimal. This results is a very effective utilization of chip area in case of LDVMISFETs, as compared to vertical transistors. This advantage is further increased as the blocking voltage rating of the LDVMISFET is increased.

Ion implantation and dopant diffusion are significatntly more challenging processes for most widebandgap semiconductor fabrication than for silicon fabrication. Since many power transistor designs fabricated from silicon use ion implantation and diffusion, many power transistor designs in widebandgap continue to use these steps for conventional device fabrication. These ion implantation steps are required for edge termination designs in conventional power transistors, and these steps result in low yields and high costs for convention power transistor fabrication. However, LDVMISFETs offer an easy way to avoid these ion implantation steps, because the resurf layer is used to terminate the high electric fields in the device.

A number of exemplary implementations have been described. Nevertheless, it will be understood that various modifications may be made. For example, suitable results may be achieved if the steps of described techniques are performed in a different order and/or if components in a described system, architecture, device, or circuit are combined in a different manner and/or replaced or supplemented by other components. Accordingly, other implementations are within the scope of the following claims.

What is claimed is:

1. A lateral drift vertical metal-insulted field effect transistor (LDVMISFET) formed in a widebandgap semiconductor comprising:
    one or more layers of the widebandgap semiconductor having a first conductivity and a first and a second surface;
    one or more layers of the widebandgap semiconductor having a second conductivity formed in contact with the first surface of the one or more layers of the first conductivity, including at least a resurf layer;
    a sub-source terminal formed in contact with the second surface of the one or more layers of the first conductivity;
    one or more mesa regions formed in contact with the resurf layer including a source terminal and a gate terminal;
    a drain region in contact with the resurf layer spaced apart from the mesa regions;
    a vertical conduction path in the mesa region; and
    a lateral current conduction path in the one or more layers of the second conductivity type between the mesa region and the Drain region.

2. The LDVMISFET of claim 1 having a lateral breakdown voltage between the gate terminal and the drain region and a vertical breakdown voltage between the drain region and the sub-source, wherein the lateral breakdown voltage is less than or equal to the vertical breakdown voltage.

3. The LDVMISFET of claim 1 having a blocking voltage of 300 V to 25 kV.

4. The LDVMISFET of claim 1 wherein one or more layers of the first conductivity includes a substrate layer having a carrier concentration of dopant atoms of 0 cm$^{-3}$ to $1\times10^{22}$ cm$^{-3}$.

5. The LDVMISFET of claim 4 wherein the substrate layer has a thickness of 100 to 500 μm.

6. The LDVMISFET of claim 1 wherein the resurf layer has a carrier concentration of dopant atoms of $1\times10^{15}$ cm$^{-3}$ to $1\times10^{19}$ cm$^{-3}$.

7. The LDVMISFET of claim 6 wherein the resurf layer has a thickness of 0.01 to 5 μm.

8. The LDVMISFET of claim 4 wherein the one or more layers of the first conductivity include a layer between the substrate layer and the resurf layer having a carrier concentration of dopant atoms of less than $10^{17}$ cm$^{-3}$.

9. The LDVMISFET of claim 1 wherein the semiconductor has a bandgap EG greater than 2 eV and less than 8 eV.

10. The LDVMISFET of claim 1 wherein the semiconductor is one of silicon carbide, diamond, aluminum nitride, and gallium nitride.

11. The LDVMISFET of claim 10 wherein the face of the silicon carbide is one of 0001, 000-1, and 11-20.

12. The LDVMISFET of claim 1 wherein having a specific on resistance of less than 300 mΩ-cm$^2$.

13. The LDVMISFET of claim 1 wherein the first conductivity is p type and the second conductivity is n type.

14. The LDVMISFET of claim 1 wherein the one or more mesa regions include a region of the first conductivity and at least one region of the second conductivity, each forming a wall of the mesa region, the vertical conduction path formed between the source region and the region of the first conductivity.

15. The LDVMISFET of claim 14 further comprising an insulator formed on the wall, wherein the gate is formed on the insulator.

16. The LDVMISFET of claim 15 wherein the gate is formed in the 11-20 plane.

17. The LDVMISFET of claim 16 wherein the first conductivity is p type and the second conductivity is n type.

18. The LDVMISFET of claim 15 comprising at least two mesa regions per drain region.

19. The LDVMISFET of claim 15 comprising at least three mesa regions per drain region.

20. The LDVMISFET of claim 16 comprising at least two mesa regions per drain region.

21. The LDVMISFET of claim 16 comprising at least three mesa regions per drain region.

22. The LDMVISFET of claim 16 comprising more than three mesa regions per drain region.

\* \* \* \* \*